United States Patent
Inoue et al.

(10) Patent No.: US 6,812,546 B2
(45) Date of Patent: Nov. 2, 2004

(54) CURRENT MIRROR CIRCUIT AND OPTICAL SIGNAL CIRCUIT USING SAME

(75) Inventors: Takahiro Inoue, Kitakatsuragi-gun (JP); Naruichi Yokogawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/614,058

(22) Filed: Jul. 8, 2003

(65) Prior Publication Data

US 2004/0007714 A1 Jan. 15, 2004

(30) Foreign Application Priority Data

Jul. 10, 2002 (JP) ........................................ 2002-201322

(51) Int. Cl.[7] ..................... H01L 27/082; H01L 27/102; H01L 29/70; H01L 31/11
(52) U.S. Cl. ...................................... 257/565; 257/577
(58) Field of Search ................................ 257/517, 526, 257/557, 565, 566, 575, 577

(56) References Cited

U.S. PATENT DOCUMENTS 6,570,237 B2 * 5/2003 Kitamura ................... 257/499

FOREIGN PATENT DOCUMENTS

| JP | 3-262153 A | 11/1991 |
|----|-----------|---------|
| JP | 6-45536 A | 2/1994 |

* cited by examiner

Primary Examiner—Hoai Pham
(74) Attorney, Agent, or Firm—Birch, Stewart, Kolasch & Birch, LLP

(57) ABSTRACT

When a current mirror circuit is composed of transistors that inevitably form a parasitic photodiode between an epitaxial layer and a substrate layer because of structure of an integrated circuit, a photocurrent increases in proportional to an area of the epitaxial layer. Thus, the area of the epitaxial layer is adjusted in accordance with a current ratio of the current mirror, so as to allow the photocurrent to affect equally on both input and output sides of the current mirror circuit, i.e., so as to cancel the photocurrent. With this, in a current mirror circuit provided in an integrated circuit, it is possible to eliminate the influence of the photocurrent, without considerably increasing an element area or taking special measures to shield light.

14 Claims, 12 Drawing Sheets

CURRENT MIRROR CIRCUIT AND OPTICAL SIGNAL CIRCUIT USING SAME

FIELD OF THE INVENTION

The present invention relates to a current mirror circuit formed in an integrated circuit. Further, the present invention relates to an optical signal circuit, which includes the integrated circuit having the current mirror circuit, and which is provided in a vicinity of an electro-optic conversion element and a photo-electric conversion element such as a light-emitting diode and a photodiode.

BACKGROUND OF THE INVENTION

In an integrated circuit (an IC for infrared remote control reception, optical pickup signal reception, LED driving, etc.) provided in a vicinity of an electro-optic conversion element (such as a light-emitting diode) and an photo-electric conversion element (such as a photodiode), diffracted and scattered light due to signal light, and noise light such as fluorescent light generate a photocurrent at a parasitic photodiode, thereby causing circuit malfunction.

A p-type transistor, in particular, has a large area of an n-type epitaxial layer (base diffusion layer). Thus, the photocurrent at the parasitic photodiode increases a base current, thereby significantly affecting the circuit characteristics. This will be explained with reference to FIGS. 7 through 10.

FIG. 7 is a diagram schematically showing a structure of a p-type transistor 1, and FIG. 8 is its equivalent circuit diagram.

In this structure, an n-type epitaxial layer 3 is formed on a p-type substrate layer 2. The n-type epitaxial layer 3 is separated by a trench 4, and each separated n-type epitaxial layer 3 becomes an element region.

Here, because of the structure of the integrated circuit, a parasitic photodiode 5 is generated between the n-type epitaxial layer 3 and the substrate layer 2. Further, the parasitic photodiode 5 is connected between the base terminal of the p-type transistor 1 and the substrate layer 2 (ground).

Thus, as shown in FIG. 7, when light incidence causes a photocurrent Ipd that flows from the n-type epitaxial layer 3 toward the substrate 2, the photocurrent Ipd serves as a base current of the p-type transistor 1, thereby significantly affecting the circuit characteristics.

Because the photocurrent Ipd increases in accordance with an amount of incident light, the photocurrent Ipd increases when the p-type transistor 1 is located in a vicinity of the photo-electric conversion element. Further, since the photocurrent Ipd increases in accordance with an area S of the n-type epitaxial layer 3, the photocurrent Ipd increases in accordance with a current capacitance of the p-type transistor 1.

Likewise, FIG. 9 is a diagram schematically showing a structure of an n-type transistor 11, and FIG. 10 is its equivalent circuit diagram.

In this structure, an n-type epitaxial layer 13 is formed on a p-type substrate layer 12. The n-type epitaxial layer 13 is separated by a trench 14, and each separated n-type epitaxial layer 13 becomes an element region.

Here, because of the structure of the integrated circuit, a parasitic photodiode 15 is generated between the n-type epitaxial layer 13 and the substrate layer 12. Further, the parasitic photodiode 15 is connected between the collector terminal of the n-type transistor 11 and the substrate layer 12 (ground).

Thus, as shown in FIG. 9, when light incidence causes a photocurrent Ipd that flows from the n-type epitaxial layer 13 toward the substrate 12, the photocurrent Ipd bypasses a collector current of the n-type transistor 11, thereby significantly affecting the circuit characteristics.

The photocurrent Ipd increases in accordance with an amount of incident light, and increases in accordance with an area S of the n-type epitaxial layer 13. However, the n-type transistor 11 has larger current driving force compared with the p-type transistor 1, and can reduce the area S of the n-type epitaxial layer 13. Further, in the n-type transistor 11, the generated photocurrent influences the collector current, so that the influence of the photocurrent seems to be smaller by an amount corresponding to a current amplification ratio.

As a method to reduce the influences of the photocurrent due to the parasitic photodiodes 5 and 15, an element front face may be covered with wiring metal so as to shield light entering therefrom.

However, this method may not be able to sufficiently address light entering from a chip side face and a chip edge which cannot shield light. Further, in these years, because of the demand to cut costs by reducing a chip area and the number of masks, the wiring metal can no longer shield light sufficiently. Further, in accordance with the trend for low current consumption to save energy, the influence of the photocurrent due to the parasitic photodiode are relatively increasing.

Japanese Unexamined Patent Publication No. 262153/1991 (Tokukaihei 3-262153, published on Nov. 21, 1991; corresponding to Japanese Patent Publication No. 2634679) discloses a typical conventional technique that eliminates the influence of the photocurrent due to the parasitic photodiode in terms of circuit configuration.

FIG. 11 is an electric circuit diagram in which the conventional technique is applied to a current mirror circuit. This current mirror circuit 20 has a current mirror section 21 composed of a pair of p-type transistors q1 and q2.

The emitters of the transistors q1 and q2 are both connected to a high-level power supply. Further, the input-side transistor q1 has a diode structure in which the base and the collector are connected with each other. From the base and collector, a signal current iin is drawn out by a signal source 22.

The base of the output-side transistor q2 is connected to the base and collector of the transistor q1. Thus, the collector of the output-side transistor q2 outputs an output current iout, which is the signal current iin that is mirrored by a current ratio i2/i1 of the transistors q1 and q2.

When areas of the n-type epitaxial layers of the transistors q1 and q2 are s1 and s2, respectively, a photocurrent ipd flowing out from the bases of the transistors q1 and q2 is expressed as follows:

$$ipd = (s1+s2) \times io, \qquad (1)$$

where io is a value of photocurrent per unit area of the n-type epitaxial layer.

To compensate the photocurrent ipd, a current mirror section 23 composed of a pair of p-type transistors q3 and q4 is provided. The emitters of the transistors q3 and q4 are both connected to a high-level power supply. Further, the input-side transistor q3 has a diode structure in which the base and the connector are connected with each other. The base of the output-side transistor q4 is connected to the base and collector of the transistor q3.

Thus, the collector of the output-side transistor q4 outputs a compensation current ic, which is obtained by amplifying a photocurrent ipdc that flows out from the bases of the transistors q3 and q4. The compensation current ic is then supplied to the bases of the transistors q1 and q2.

When areas of the n-type epitaxial layers of the transistors q3 and q4 are s3 and s4, respectively, the photocurrent ipd is expressed as follows.

$$ipdc=(s3+s4) \times io \qquad (2)$$

Then, for simplicity, the base currents of the transistors q3 and q4 are ignored, namely, a current amplification ratio hfe is assumed to ∞ (infinity). Here, when areas of the n-type epitaxial layers of the transistors q1, q2, q3, and q4 are s1, s2, s3, and s4, respectively, and i2/i1 and i4/i3 are current ratios of the current mirror sections 21 and 23, respectively, Kirchhoff law gives the following equations.

$$ic=(i4/i3) \times (s3+s4) \times io \qquad (3)$$

$$iout=(i2/i1) \times (iin+(s1+s2) \times io-ic) \qquad (4)$$

These two equations further derive the following equation.

$$iout=(i2/i1) \times (iin+((s1+s2)-(i4/i3) \times (s3+s4)) \times io) \qquad (5)$$

Therefore, by satisfying the following equation (6), a parasitic photodiode ic generated at a parasitic photodiode pdc of the transistors q3 and q4 can cancel the photocurrent ipd generated at a parasitic photodiode pd of the transistors q1 and q2.

$$(s1+s2)=(i4/i3) \times (s3+s4) \qquad (6)$$

However, the current mirror circuit 20 has problems (a) and (b) as shown below.

(a) Because the output impedance of the output transistor q2 is low, variation in a collector-emitter voltage Vce (q2) of the output transistor q2 varies the output current iout. Namely, the dependence of the collector current Ic of a transistor on the collector-emitter voltage Vce is generally expressed as follows.

$$Ic=Is \times (1+Vce/Va) \times exp(Vbe/Vt) \qquad (7)$$

where Is is a saturation current of the transistor, Va is Early voltage, Vbe is a base-emitter voltage, and Vt is kt/q (where k is the Boltzmann constant, T is the absolute temperature, and q is an elementary charge of electron).

Therefore, applying this to the equation (5) derives the following equation.

$$iout=(Va+Vce(q2))/(Va+Vce(q1)) \times (i2/i1) \times iin \qquad (8)$$

This shows that variation in the collector-emitter voltages Vce (q1) and Vce (q2) varies the output current iout.

(b) The strong influence of the base current causes an error in the output current. Namely, in the above-described calculation, the influence of the base current is ignored, namely, the current amplification ratio hfe is assumed to ∞, for simplicity. However, an actual value of the current amplification rate hfe is generally about 100, and thus influence thereof is not negligible.

A base current ib is expressed as follows.

$$ib=ic/hfe \qquad (9)$$

Further, base currents ib (q1) and ib (q2) of the transistors q1 and q2 directly affect the input current iin. Thus, the output current iout is expressed as follows.

$$iout=(hfe/(hfe+1+i2/i1)) \times (i2/i1) \times iin \qquad (10)$$

This shows that the base current ib causes an error in the output current iout. Further, the current amplification ratio hfe relates to the collector current ic. Namely, a minute collector current tends to decrease the current amplification ratio hfe. Thus, such a minute current increases the error in the base current ib.

To solve these problems, Japanese Unexamined Patent Publication No. 45536/1994 (Tokukaihei 6-45536, published on Feb. 18, 1994; corresponding to Japanese Patent Publication No. 2906387) discloses another conventional technique that eliminates the influence of the photocurrent due to the parasitic photodiode in terms of circuitry.

FIG. 12 is an electric circuit diagram in which the conventional technique is applied to a current mirror circuit.

Note that, this current mirror circuit 30 is similar to the current mirror circuit 20, and identical members with those used in the previous explanation are assigned, thus their explanation is omitted here.

As shown in FIG. 12, the current mirror sections 21 and 23 are arranged similarly to those in the previous arrangement. Notable in the current mirror circuit 30 is that the current mirror circuit 30 is provided with an output transistor q5.

The emitter of the output transistor q5 is supplied with a collector current of the output-side transistor q2 having a diode structure in which the base and the collector are connected with each other. The base of the output transistor q5 is connected to the collector of the input-side transistor q1. The collector of the output transistor q5 outputs an output current.

Further, with respect to the output transistor q5, a current mirror section 31 composed of a pair of p-type transistors q6 and q7 is also provided to compensate its photocurrent ipd5.

The emitters of the transistors q6 and q7 are both connected to a high-level power supply. The input-side transistor q6 has a diode structure in which the base and the collector are connected with each other. The base of the output-side transistor q7 is connected to the base of the transistor q5 and the collector of the transistor q1. The collector of the transistor q7 is connected to the base of the output transistor q5, namely the collector of the transistor q1.

By additionally providing the output transistor q5, the current mirror circuit 30 can keep the collector-emitter voltages Vce (q1) and Vce (q2) of the transistors q1 and q2 to be constant, even when a collector voltage Vce (q5) of the output transistor q5 varies. This can reduce the variation in the output current iout, thus addressing the problem (a).

Further, as for the problem (b), an amount of the base currents ib (q1) and ib (q2) of the transistors q1 and q2 that affects the input current iin can be reduced to 1/hfe by the output transistor q5.

As described above, the current mirror circuit 30 is a high-precision current mirror circuit that improves the output impedance and compensates the base currents ib (q1) and ib (q2).

The above-described conventional techniques eliminate the need for taking special measures to shield light, such as covering the element front face with wiring metal. However, the need to provide the current mirror sections 23 and 31 causes a problem of increasing a chip area and costs.

SUMMARY OF THE INVENTION

In order to solve the foregoing conventional problems, an object of the present invention is to provide a current mirror circuit capable of eliminating the influence of a photocurrent due to a parasitic photodiode, without considerably increasing an element area or taking special measures to shield light, and an optical signal circuit using the same.

A current mirror circuit of the present invention, provided in an integrated circuit, is so arranged that an area of an epitaxial layer is adjusted in accordance with a current ratio of the current mirror so as to eliminate an influence of a photocurrent due to a parasitic photodiode.

Because of the structure of an integrated circuit, a parasitic photodiode is generated between the epitaxial layer and the substrate layer in the transistor. Under the circumstances where the parasitic photodiode is exposed to light, the photocurrent due to the parasitic photodiode emerges and influences the circuit.

Thus, the present invention takes notice of a fact that the photocurrent increases in proportion to the area (size) of the epitaxial layer.

Namely, when a current mirror circuit is composed of transistors that inevitably form the parasitic photodiode, the area of the epitaxial layer in the transistor is adjusted in accordance with the current ratio of the current mirror, so as to allow the photocurrent to affect equally on both input and output sides of the current mirror circuit (namely, so as to cancel the photocurrent).

With this, in the current mirror circuit, it is possible to eliminate the influence of the photocurrent due to the parasitic photodiode, without considerably increasing an element area or taking special measures to shield light.

Note that, the area of the epitaxial layer becomes larger than an area corresponding to a required current capacitance, but still smaller than in a case where a compensating circuit is additionally provided.

For a fuller understanding of the nature and advantages of the invention, reference should be made to the ensuing detailed description taken in conjunction with the accompanying drawings.

DESCRIPTION OF THE EMBODIMENTS

The following will explain First Embodiment of the present invention.

Figure 1:
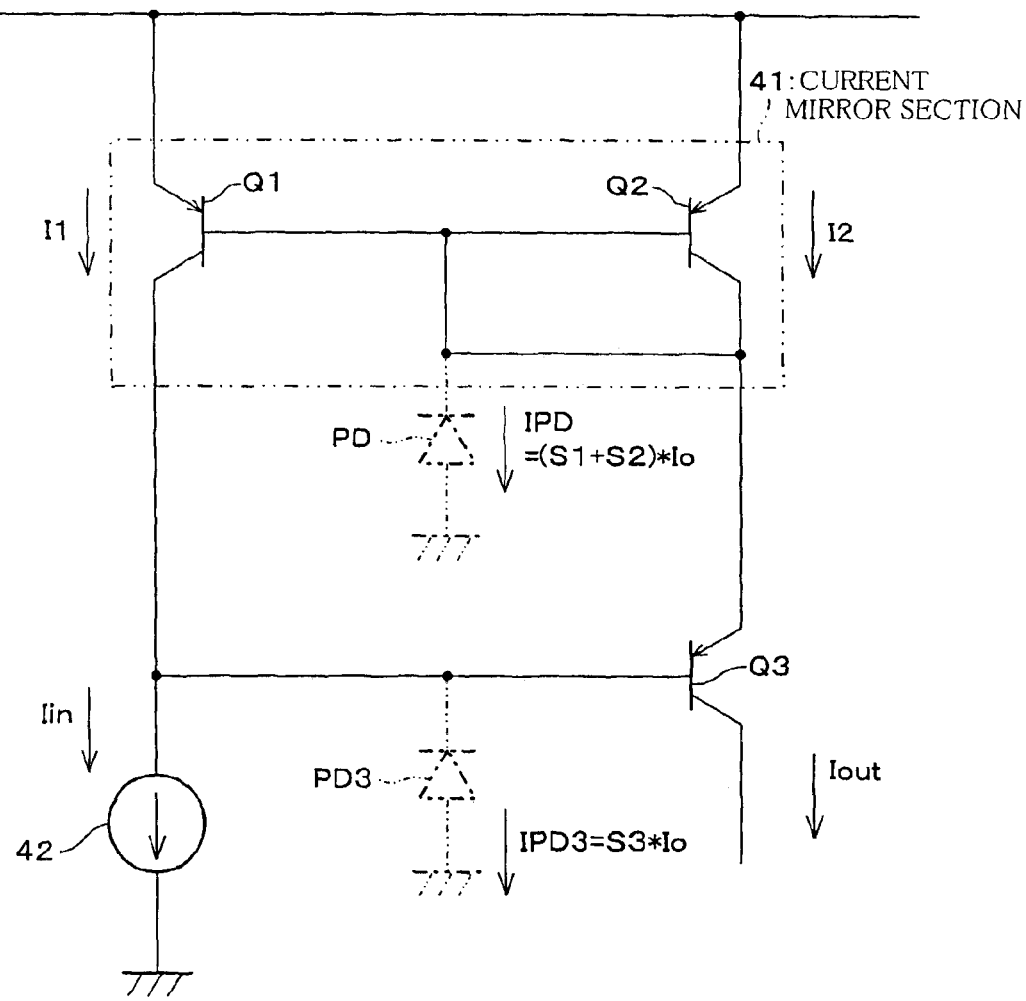
FIG. 1 is an electrical diagram of a current mirror circuit in accordance with First Embodiment of the present invention.

FIG. 1 is an electrical diagram of a current mirror circuit 40, which is First Embodiment of the present invention.

The current mirror circuit 40 is composed of a current mirror section 41 having a pair of p-type transistors Q1 and Q2, and an adjusting transistor Q3.

The emitters of the transistors Q1 and Q2 are both connected to a high-level power supply. A signal current Iin is drawn out from the collector of the input-side transistor Q1 by a signal source 42.

The output-side transistor Q2 has a diode structure in which the base and the collector are connected with each other.

The base and collector of the transistor Q2 is connected to the base of the transistor Q1 and the emitter of the adjusting transistor Q3. The base of the adjusting transistor Q3 is connected to the collector of the input-side transistor Q1, i.e., the signal source 42.

Thus, the collector of the adjusting transistor Q3 can output an output current Iout. The output current Iout is obtained by multiplying the signal current Iin that flows into the signal source 42 by a current ratio I2/I1 of the transistors Q1 and Q2.

Further, in the adjusting transistor Q3, even when a collector voltage varies due to the circuit impedance on the output side, the variation can be absorbed because a base-emitter voltage varies.

This allows collector-emitter voltages Vce (Q1) and Vce (Q2) of the transistors Q1 and Q2 to be constant, thereby reducing variation in the output current Iout.

Further, an amount of base currents Ib (Q1) and Ib (Q2) of the transistors Q1 and Q2 that affects the input current Iin can be reduced to 1/hfe by the adjusting transistor Q3.

Figure 12:
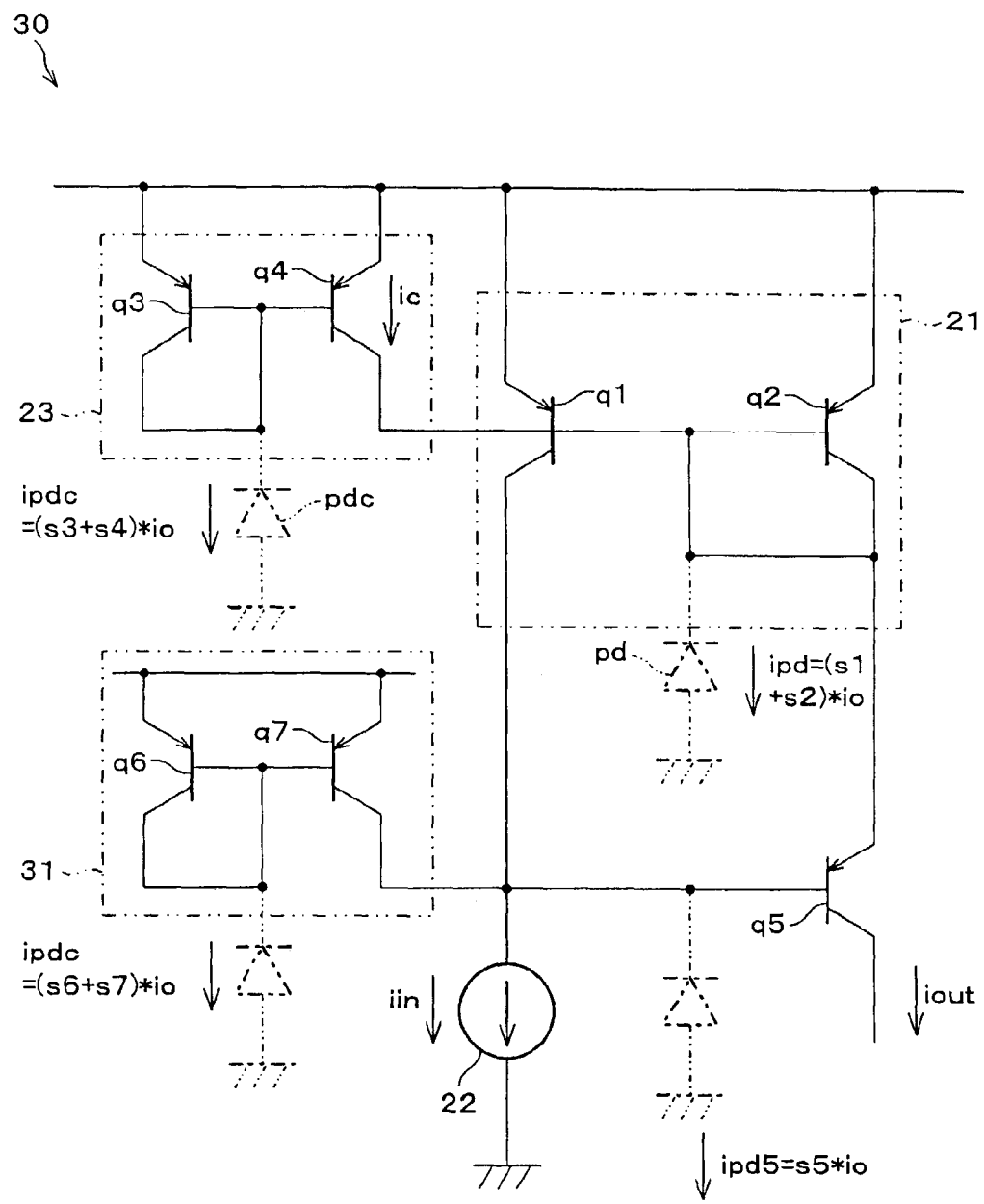
FIG. 12 is an electric circuit diagram in which another conventional technique is applied to a current mirror circuit.

Thus, the current mirror circuit 40 is a high-precision current mirror circuit that improves the output impedance, and compensates the base currents Ib (Q1) and Ib (Q2), like the current mirror circuit 30 as shown in FIG. 12.

Notable in this current mirror circuit 40 are the following points.

Figure 7:
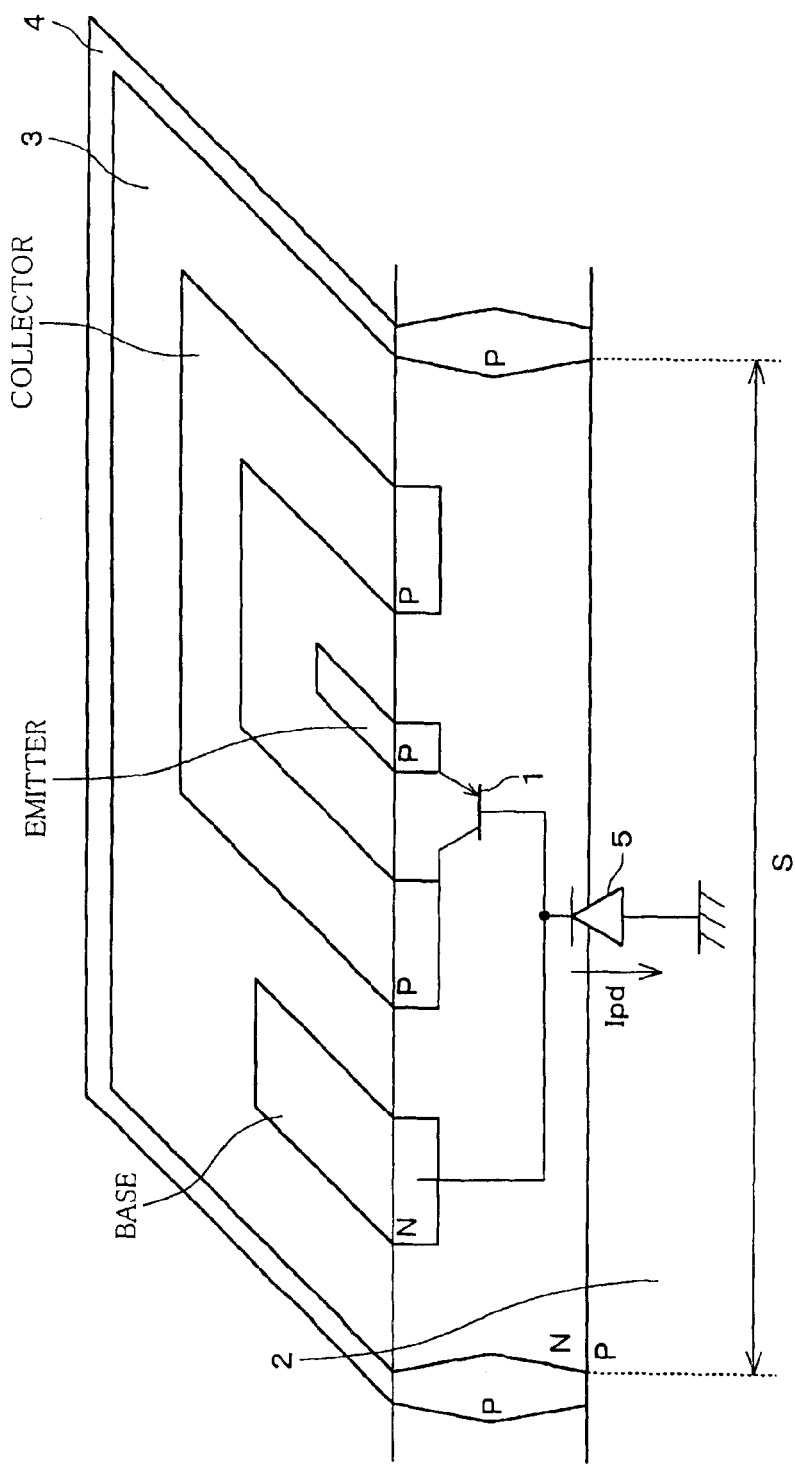
FIG. 7 is a diagram schematically showing a structure of a p-type transistor.
Figure 8:
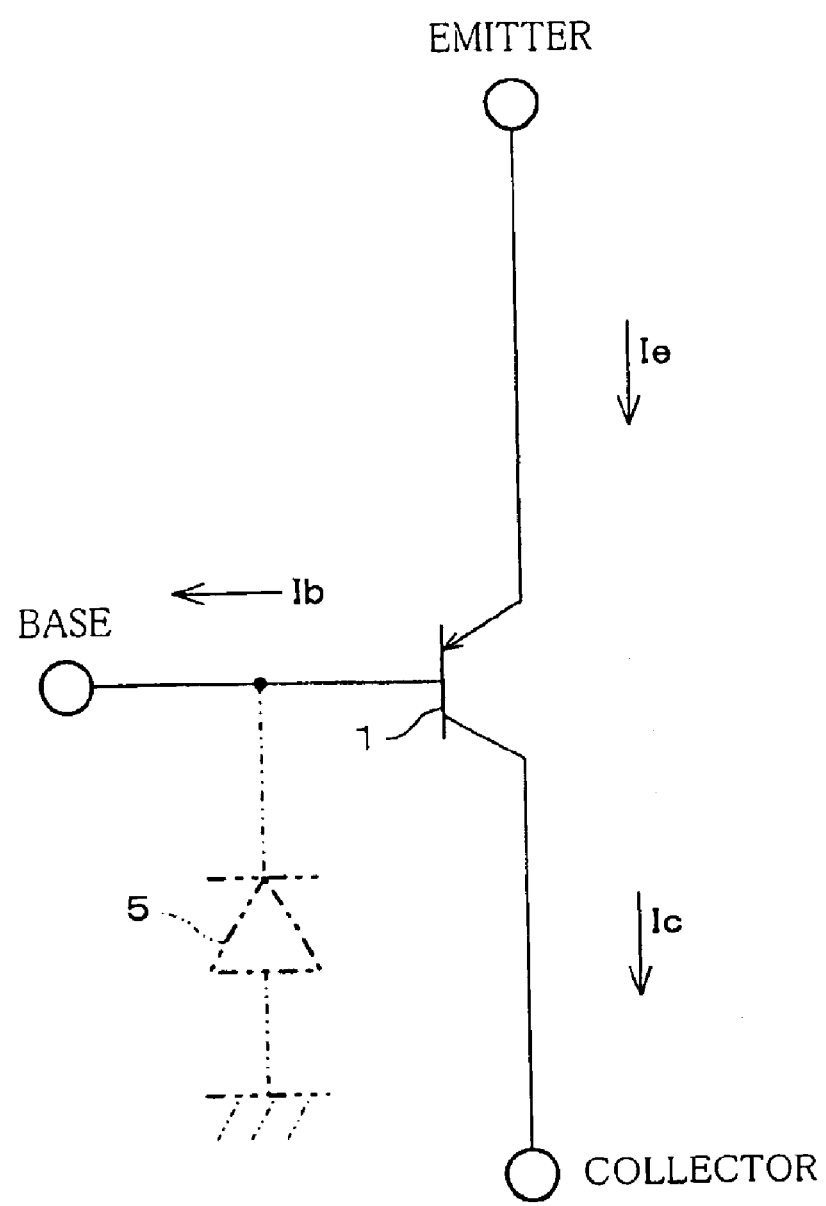
FIG. 8 is an equivalent circuit diagram of the p-type transistor shown in FIG. 7.

Each of the transistors Q1 through Q3 is made of a p-type transistor in which an n-type epitaxial layer is formed on a p-type substrate layer, as shown in FIG. 7.

An area S3 of the n-type epitaxial layer in the adjusting transistor Q3 is set to satisfy the following equation (11):

$$S3 = (I1/I2) \times (S1 + S2), \tag{11}$$

where I2/I1 is a current ratio of the current mirror section 41.

Namely, with ignoring the base currents of the transistors Q1 and Q2 for simplicity (hfe=∞), where a current flowing through a parasitic diode PD of the transistors Q1 and Q2 is IPD, and a current flowing through a parasitic diode PD3 of the adjusting transistor Q3 is IPD3, Kirchhoff law gives the following equations.

$$Iin+IPD=I1 \quad (12)$$

$$Iout=I2-IPD3 \quad (13)$$

Here, since the photocurrents IPD and IPD3 are proportional to the area of the n-type epitaxial layer, the following equations are further obtained:

$$IPD=(S1+S2) \times Io \quad (14)$$

$$IPD3=S3 \times Io \quad (15)$$

where Io is a value of photocurrent per unit area of the n-type epitaxial layer.

This derives the following equation.

$$Iout=(I2/I1) \times (Iin+(S3-(I1/I2) \times (S1+S2)) \times Io) \quad (16)$$

If this satisfies the equation (11), then the following equation is obtained.

$$Iout=(I2/I1) \times Iin \quad (17)$$

The current mirror circuit 40 can therefore output the output current Iout which is the product of the signal current Iin and the current ratio I2/I1 of the current mirror section 41, without being affected by the photocurrents IPD and IPD3.

Note that, in the present invention, the area of the n-type epitaxial layer is larger than an area corresponding to a current capacitance required for the transistors Q1 through Q3.

Figure 11:
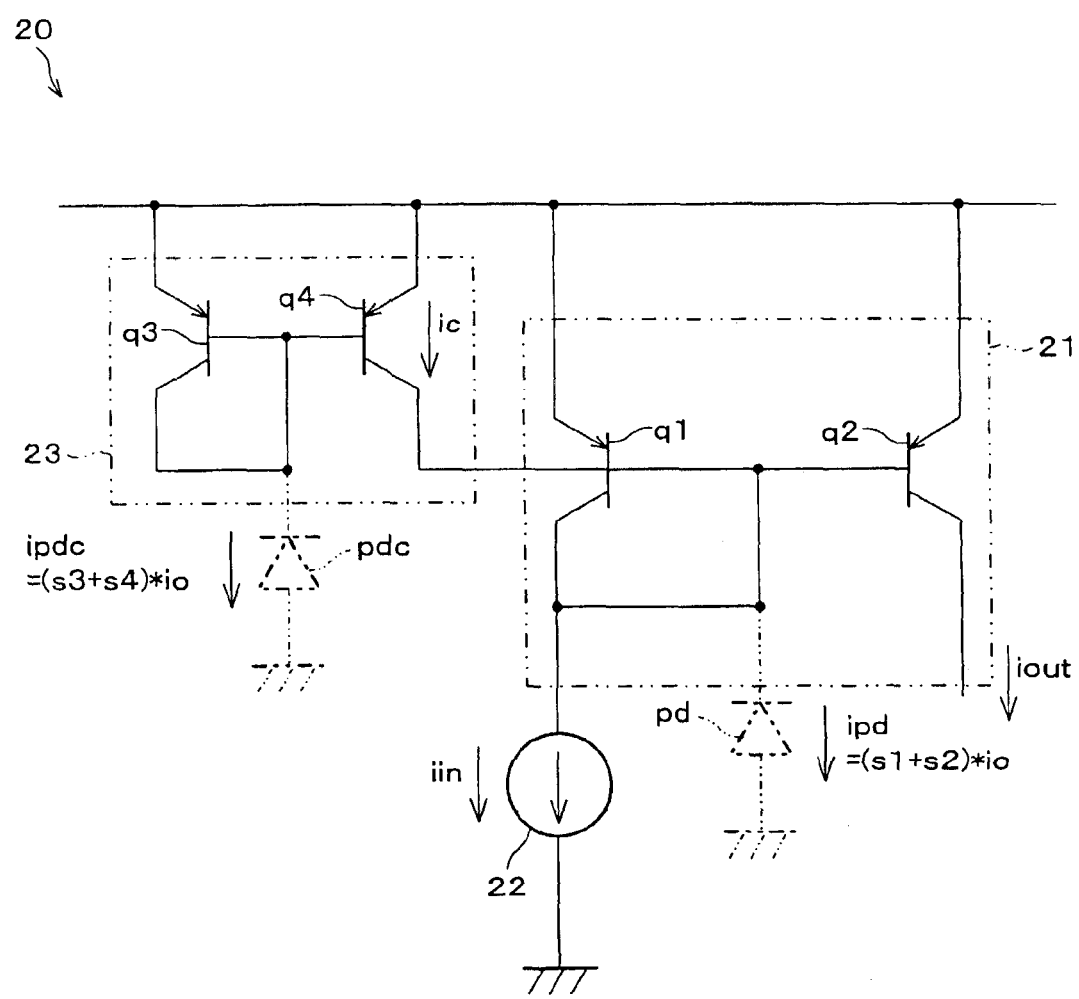
FIG. 11 is an electric circuit diagram in which a typical conventional technique is applied to a current mirror circuit.

However, the area of the n-type epitaxial layer can be reduced compared with, for example, the current mirror sections 23 and 31 of FIGS. 11 and 12 where a compensating circuit is additionally provided. The following will show a comparison between the two cases.

First, when assuming the current ratio I2/I1 of the current mirror section 41 to k/1, an area of the n-type epitaxial layer in the current mirror circuit 40 of the present invention is expressed as follows.

$$k+2+(1/k) \quad (18)$$

On the other hand, in the current mirror circuit 30 of FIG. 12, an area of the n-type epitaxial layer is expressed as follows.

$$2(k+2) \quad (19)$$

The following is consequently derived.

$$k+2+(1/k) < 2(k+2) \quad (20)$$

Thus, it is possible to realize a high-precision current mirror circuit that compensates the photocurrent IPD using a smaller number of elements.

Table 1 shows changes in the area of the epitaxial layer in accordance with changes in the current ratio I2/I1 of the current mirror section 41.

TABLE 1

| I2/I1* | PRESENT INVENTION | | | | CONVENTIONAL EXAMPLE | | | | | |
|---|---|---|---|---|---|---|---|---|---|---|
| | S1 | S2 | S3 | TOTAL AREA | s1 | s2 | s5 | s3 + s4 | s6 + s7 | TOTAL AREA |
| 1:1 | 1 | 1 | 2 | 4 | 1 | 1 | 1 | 2 | 1 | 6 |
| 2:1 | 1 | 2 | 1.5 | 4.5 | 1 | 2 | 1 | 3 | 1 | 8 |
| 3:1 | 1 | 3 | 1.33 | 5.33 | 1 | 3 | 1 | 4 | 1 | 10 |
| . | . | . | . | . | . | . | . | . | . | . |
| . | . | . | . | . | . | . | . | . | . | . |
| . | . | . | . | . | . | . | . | . | . | . |
| k:1 | 1 | k | (k+1)/k | k+2+(1/k) | 1 | k | 1 | 1+k | 1 | 2(k+2) |

*I2/I1 stands for the current ratio of the current mirror.

As described above, the current mirror circuit 40 takes notice of a feature that, when a current mirror circuit is composed of the transistors Q1 and Q2 that inevitably form the parasitic photodiode PD, the photocurrent IPD increases in proportion to the area S1+S2 of the epitaxial layers.

Then, adjusting the areas S1 and S2 of the epitaxial layers in accordance with the current ratio I2/I1 of the current mirror can allow the photocurrent IPD to affect equally on both input and output sides of the current mirror circuit 40 (can cancel the photocurrent IPD).

This makes the area S1+S2 of the epitaxial layers larger than an area corresponding to a required current capacitance, but still smaller than an area of the epitaxial layers where the compensating circuit is additionally provided.

As described above, the current mirror circuit 40 can eliminate the influence of the photocurrent IPD due to the parasitic photodiode PD, without considerably increasing the element area or taking special measures to shield light.

The following will explain Second Embodiment of the present invention.

Figure 2:
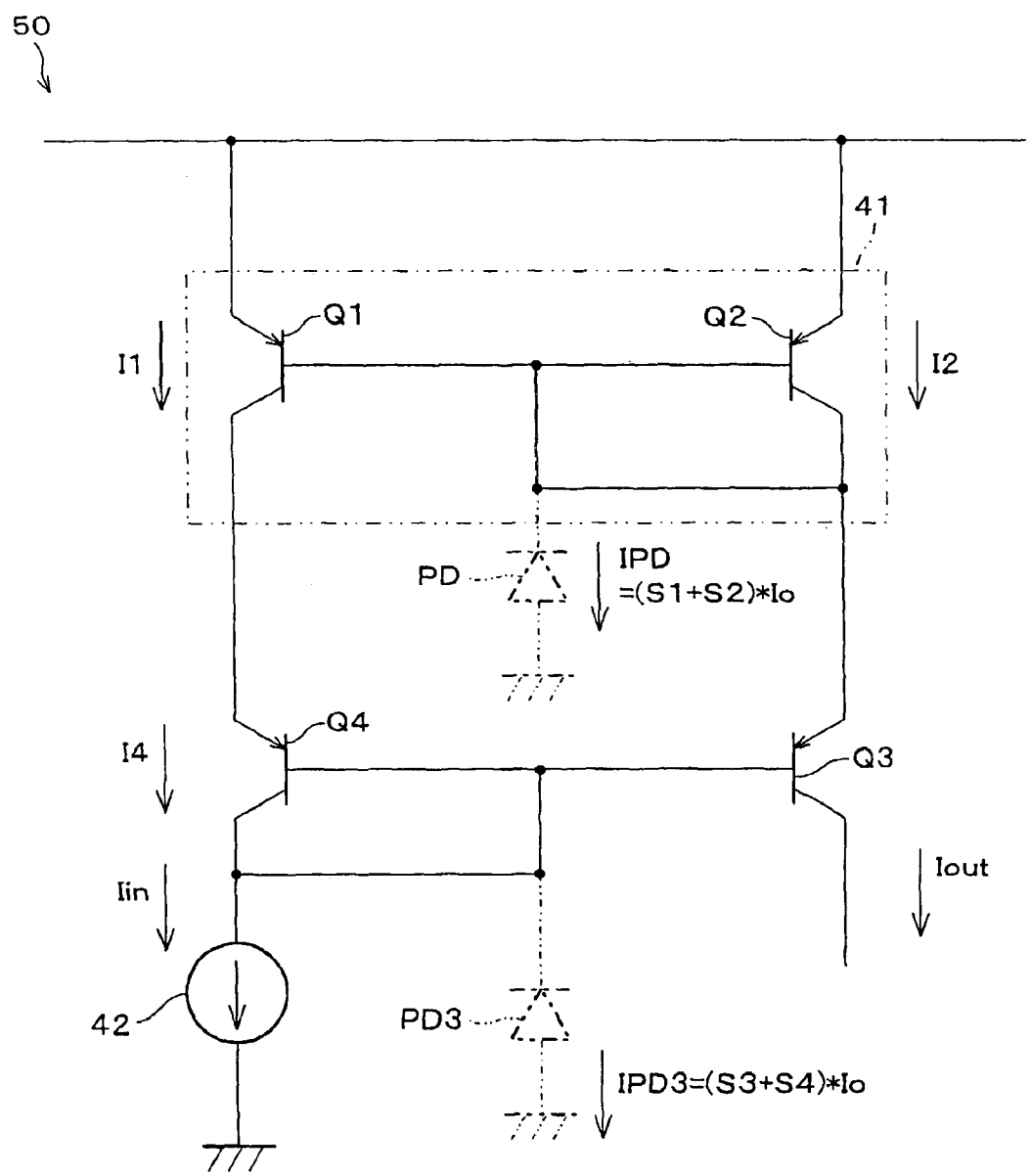
FIG. 2 is an electrical diagram of a current mirror circuit in accordance with Second Embodiment of the present invention.

FIG. 2 is an electrical diagram of a current mirror circuit 50 in accordance with Second Embodiment of the present invention. The current mirror circuit 50 is similar to the current mirror circuit 40, and identical members with those used in the previous explanation are assigned, thus their explanation is omitted here.

Notable in the current mirror circuit 50 is that a voltage equilibrating transistor Q4 made of a p-type transistor is further provided between the signal source 42 and the input-side transistor Q1.

In the voltage equilibrating transistor Q4, the emitter is connected to the collector of the input-side transistor Q1; and the base and the connector, which are connected with each other, are connected to the signal source 42 and the base of the adjusting transistor Q3.

By providing the voltage equilibrating transistor Q4, when an area of the n-type epitaxial layer of the transistor Q4 is S4, the equation (11) is modified to the following equation.

$$S3+S4=(I1/I2) \times (S1+S2) \quad (21)$$

Namely, the equation (16) is rewritten as follows.

$$Iout=(I2/I1) \times (Iin+((S3+S4)-(I1/I2) \times (S1+S2)) \times Io) \quad (22)$$

Thus, satisfying the equation (21) can eliminate the influence of the photocurrent IPD of the parasitic photodiode PD.

As described above, by adding the voltage equilibrating transistor Q4, the base-emitter voltages Vbe (Q1) and Vbe (Q2) of the transistors Q1 and Q2 become equal to each other. This accordingly makes the collector-emitter voltages Vce (Q1) and Vce (Q2) equal to each other.

Thus, applying the equation (8) to the current mirror circuit 50 derives the following equation.

$$Iout=(Va+Vce(Q2))/(Va+Vce(Q1))\times(I2/I1)\times Iin \quad (23)$$

If Vce (Q1)=Vce (Q2) is applied to this equation, then the equation (17) is obtained.

This further reduces an error in current due to the Early effect. Further, an area S4 of the n-type epitaxial layer in the voltage equilibrating transistor Q4 is preferably set to satisfy the equation (21). This eliminates the influences of the photocurrents IPD and IPD3 too.

The following will explain Third Embodiment of the present invention.

Figure 3:
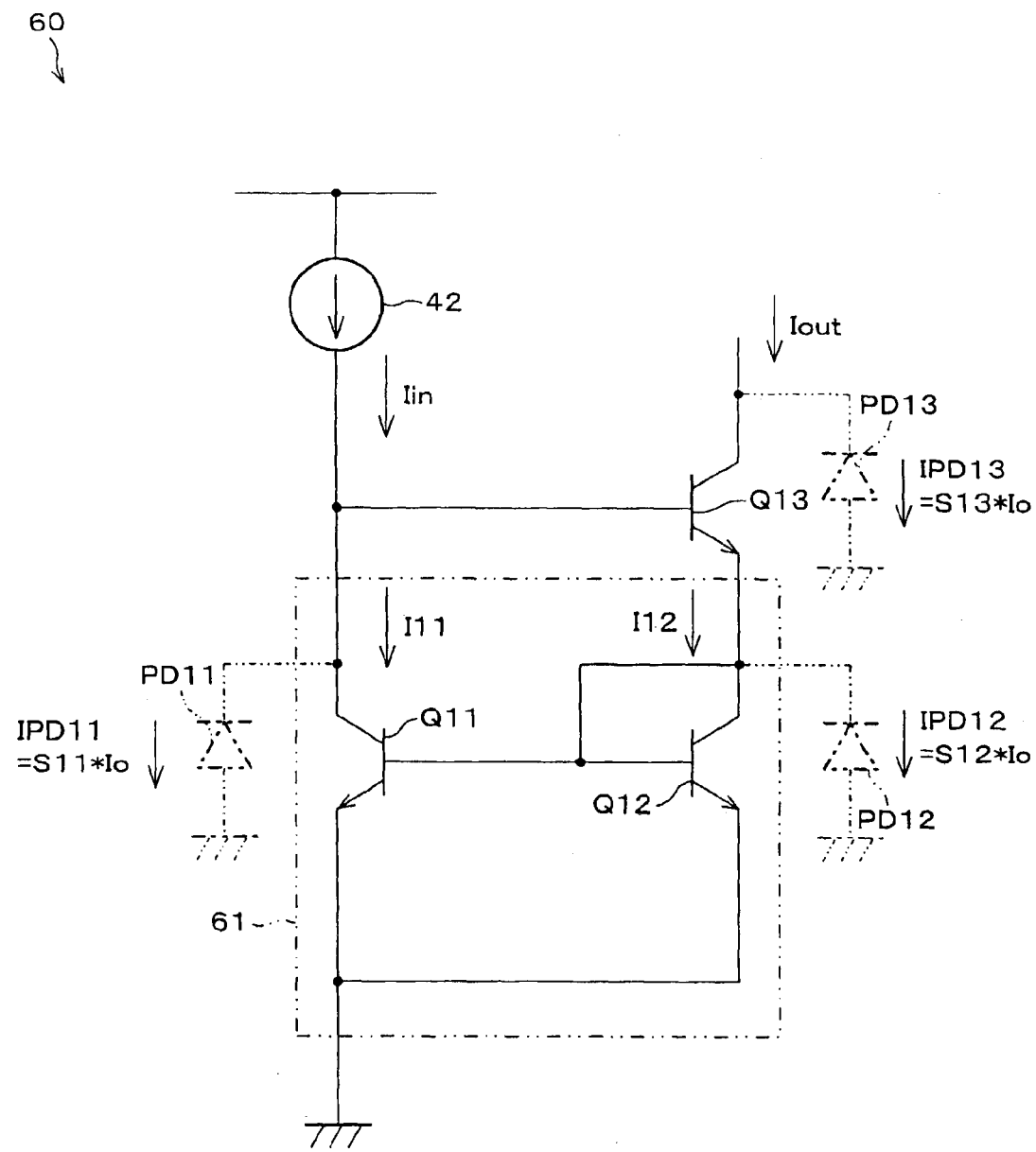
FIG. 3 is an electrical diagram of a current mirror circuit in accordance with Third Embodiment of the present invention.

FIG. 3 is an electrical diagram of a current mirror circuit 60 in accordance with Third Embodiment of the present invention. The current mirror circuit 60 is similar to the current mirror circuit 40, and identical members with those used in the previous explanation are assigned, thus their explanation is omitted here.

As described earlier, the current mirror circuit 40 is provided with the p-type transistors Q1 through Q3. In contrast, the current mirror circuit 60 includes n-type transistors Q11 through Q13.

A current mirror section 61 is composed of a pair of the transistors Q11 and Q12. The emitters of the pair of transistors Q11 and Q12 are both connected to a low-level power supply. Further, the collector of the input-side transistor Q11 absorbs (receives) the signal current Iin from the signal source 42.

The output-side transistor Q12 has a diode structure in which the base and the collector are connected with each other. The base and collector of the transistor Q12 is connected to the base of the transistor Q11 and the emitter of the adjusting transistor Q13.

The base of the adjusting transistor Q13 is connected to the collector of the input-side transistor Q11, and the signal source 42.

Thus, the collector of the adjusting transistor Q13 can absorb an output current Iout. The output current Iout is obtained by multiplying the signal current Iin that flows out from the signal source 42 by a current ratio I12/I11 of the transistors Q11 and Q12.

Further, in the adjusting transistor Q13, even when a collector voltage varies due to the circuit impedance on the output side, the variation can be absorbed because a base-emitter voltage varies. This allows collector-emitter voltages Vce (Q11) and Vce (Q12) of the transistors Q11 and Q12 to be constant, thereby reducing variation in the output current Iout.

Further, an amount of base currents Ib (Q11) and Ib (Q12) of the transistors Q11 and Q12 that affects the input current Iin can be reduced to 1/hfe by the adjusting transistor Q13.

Thus, the current mirror circuit 60 is a high-precision current mirror circuit that improves the output impedance, and compensates the base currents Ib (Q11) and Ib (Q12), like the current mirror circuit 30 as shown in FIG. 12.

Figure 9:
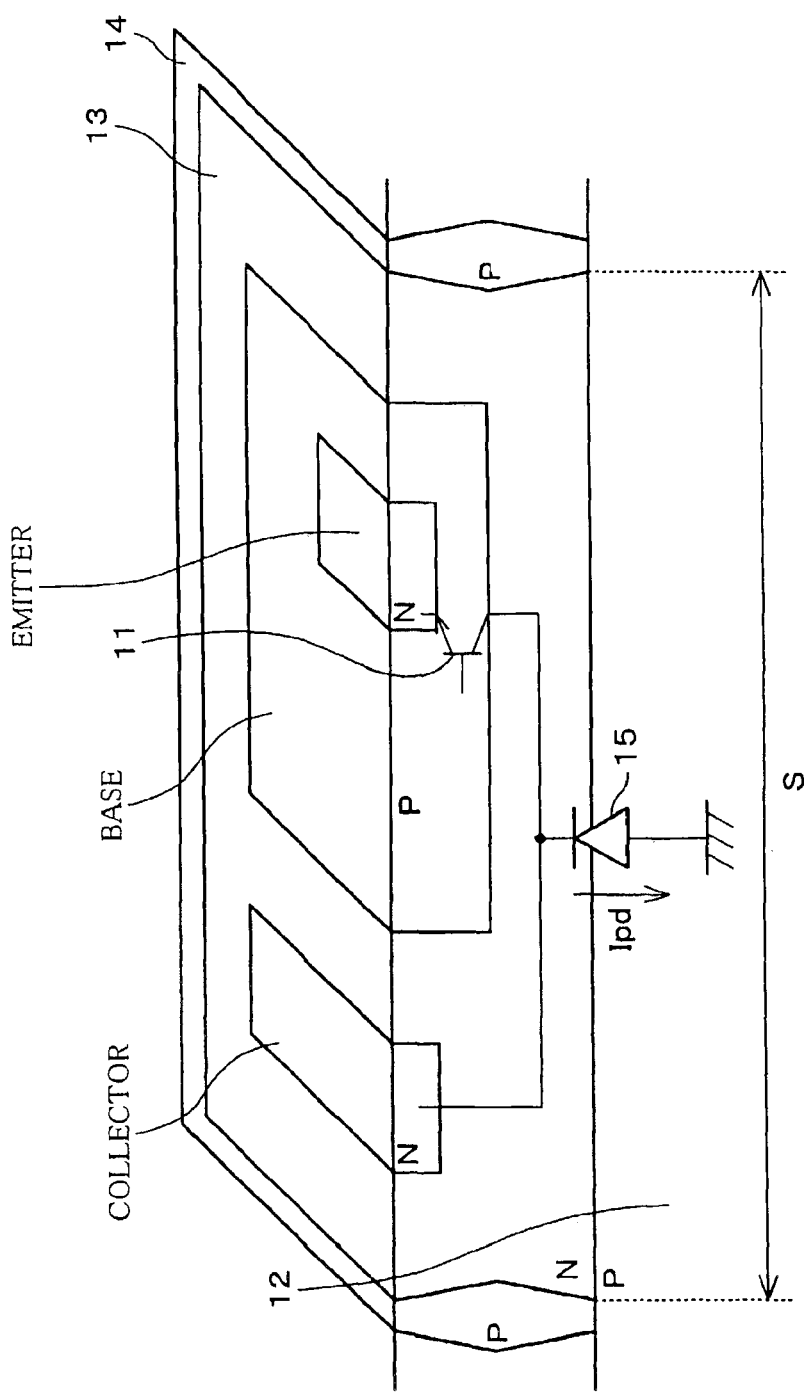
FIG. 9 is a diagram schematically showing a structure of an n-type transistor.
Figure 10:
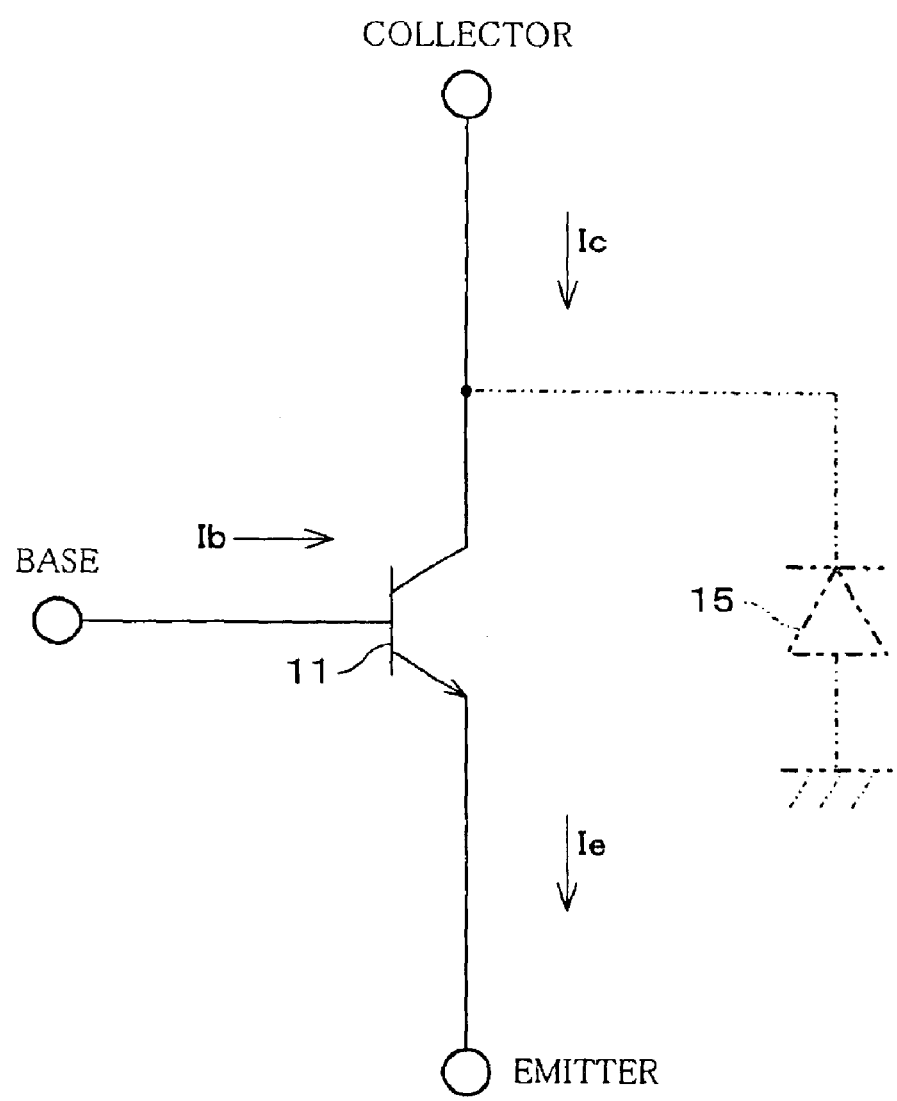
FIG. 10 is an equivalent circuit diagram of the n-type transistor shown in FIG. 9.

Further, in the current mirror circuit 60, each of the transistors Q11 through Q13 is made of an n-type transistor in which an n-type epitaxial layer is formed on a p-type substrate layer, as shown in FIG. 9.

An area S3 of the n-type epitaxial layer in the adjusting transistor Q13 is set to satisfy the following equation (24):

$$S11=(I11/I12)\times(S12+S13), \quad (24)$$

where I12/I11 is a current ratio of the current mirror section 61.

Namely, with ignoring the base currents of the transistors Q11 and Q12 for simplicity, where currents flowing through parasitic diodes PD11 and PD12 that are respectively parasitic on the collectors of the transistors Q11 and Q12 are IPD11 and IPD12, respectively, and a current flowing through a parasitic diode PD13 of the adjusting transistor Q13 is IPD13, Kirchhoff law gives the following equations.

$$Iin=I11+IPD11 \quad (25)$$

$$Iout=I12+IPD12+IPD13 \quad (26)$$

Here, since the photocurrents IPD11 through IPD13 are proportional to the area of the n-type epitaxial layer, the following equations are further obtained:

$$IPD11=S11\times Io \quad (27)$$

$$IPD12+IPD13=(S12+S13)\times Io, \quad (28)$$

This derives the following equation.

$$Iout=(I12/I11)\times(Iin-(S11-(I11/I12)\times(S12+S14))\times Io) \quad (29)$$

If this satisfies the equation (24), then the following equation is obtained.

$$Iout=(I12/I11)\times Iin \quad (30)$$

The current mirror circuit 60 can therefore absorb the output current Iout which is the product of the signal current Iin and the current ratio I12/I11 of the current mirror section 61, without being affected by the photocurrents IPD11 through IPD13.

As described above, in the n-type transistors Q11 through Q13, the photocurrents IPD11 through IPD13 serve as collector currents. Thus, though the effects are small compared with the p-type transistors Q1 through Q3 in which the photocurrents serve as base currents, the present invention can be applied to the current mirror circuit 61 composed of the n-type transistors Q11 through Q13.

The following will explain Fourth Embodiment of the present invention.

Figure 4:
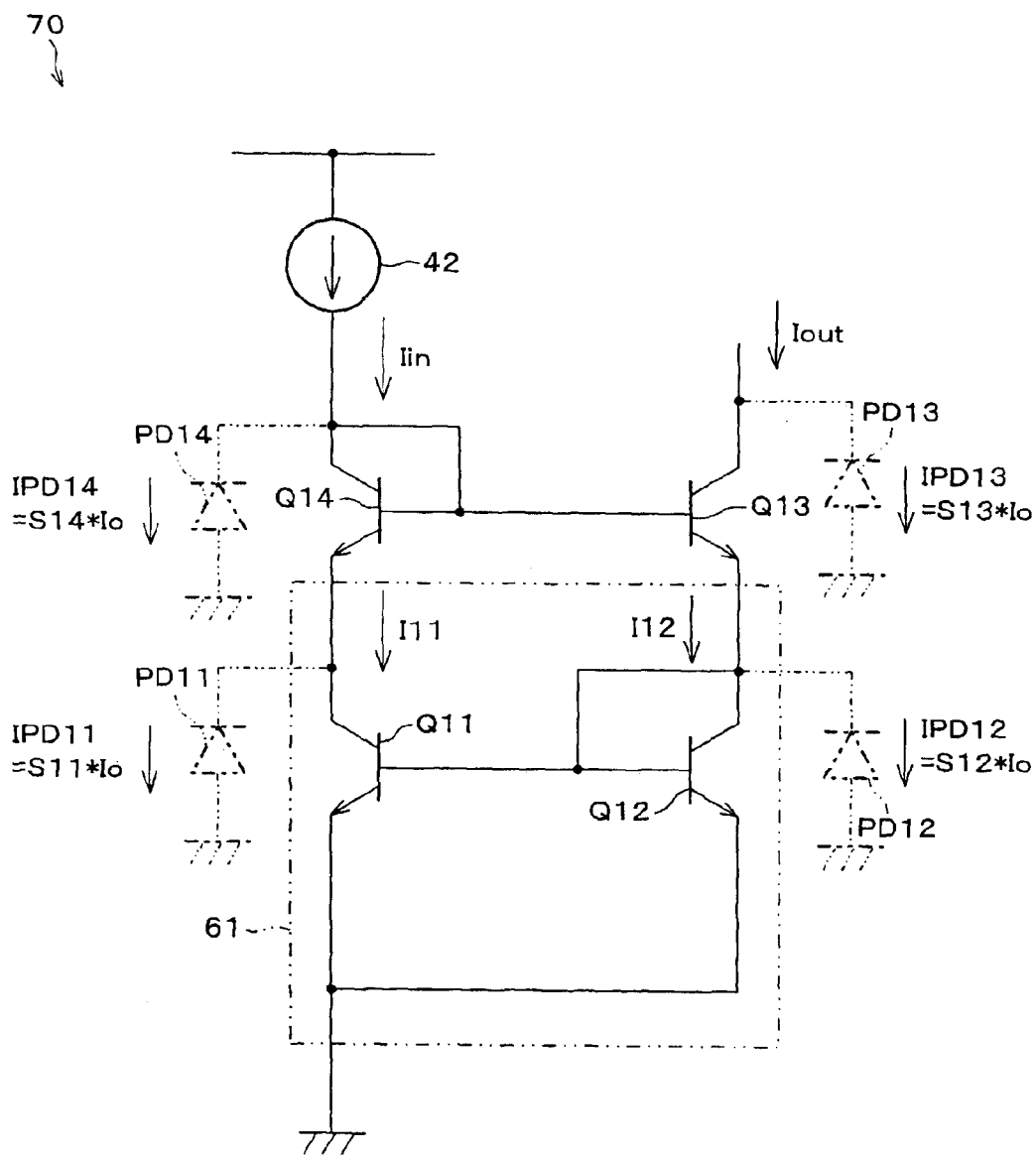
FIG. 4 is an electrical diagram of a current mirror circuit in accordance with Fourth Embodiment of the present invention.

FIG. 4 is an electrical diagram of a current mirror circuit 70 in accordance with Fourth Embodiment of the present invention. Like the current mirror circuit 50, the current mirror circuit 70 is further provided with a voltage equilibrating transistor Q14 made of an n-type transistor between the signal source 42 and the input-side transistor Q11, in an arrangement of the current mirror circuit 60 composed of the n-type transistors Q11 through Q13.

In the voltage equilibrating transistor Q14, the emitter is connected to the collector of the input-side transistor Q11; and the base and the connector, which are connected with each other, are connected to the signal source 42 and the base of the adjusting transistor Q13.

By providing the voltage equilibrating transistor Q14, when an area of the n-type epitaxial layer of the transistor Q14 is S14, the equation (24) is modified to the following equation.

$$S11+S14=(I11/I12)\times(S12+S13) \quad (31)$$

Namely, the equation (29) is rewritten as follows.

$$Iout=(I12/I11)\times(Iin-((S11+S14)-(I11/I12)\times(S12+S13))\times Io) \quad (32)$$

Thus, satisfying the equation (31) can eliminate the influences of the photocurrents IPD11 through IPD14 of the parasitic photodiodes PD11 through PD14.

As described above, by adding the voltage equilibrating transistor Q14, the base-emitter voltages Vbe (Q11) and Vbe (Q12) of the transistors Q11 and Q12 become equal to each other. This accordingly makes the collector-emitter voltages Vce (Q11) and Vce (Q12) equal to each other. This further reduces an error in current due to the Early effect.

Further, an area S14 of the n-type epitaxial layer in the voltage equilibrating transistor Q14 is preferably set to satisfy the equation (31). This eliminates the influences of the photocurrents IPD11 through IPD14 too.

The following will explain Fifth Embodiment of the present invention.

Figure 5:
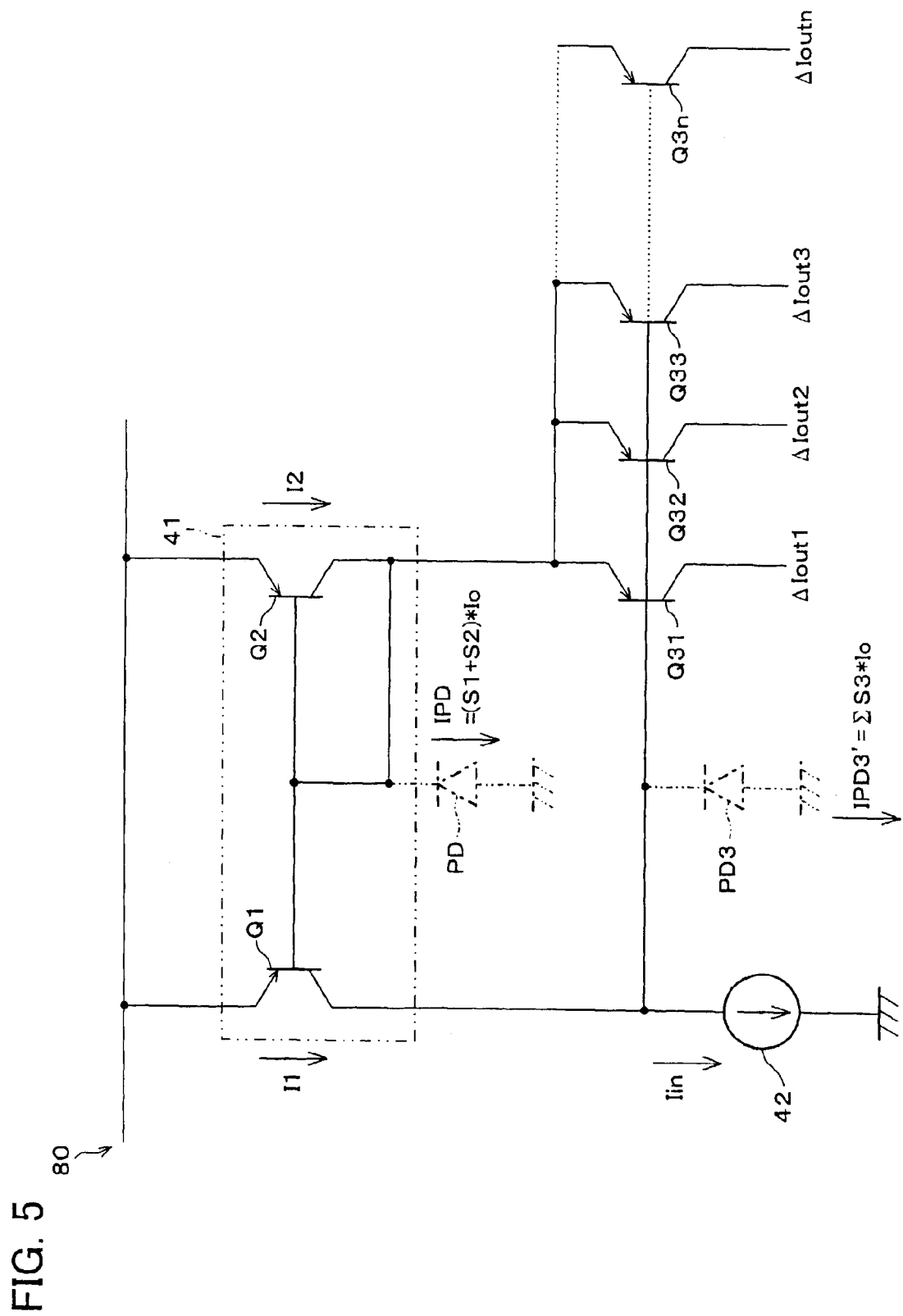
FIG. 5 is an electrical diagram of a current mirror circuit in accordance with Fifth Embodiment of the present invention.

FIG. 5 is an electrical diagram of a current mirror circuit 80 in accordance with Fifth Embodiment of the present invention. The current mirror circuit 80 is similar to the current mirror circuit 40, and identical members with those used in the previous explanation are assigned, thus their explanation is omitted here.

Notable in the current mirror circuit 80 is that the adjusting transistor Q3 has a parallel-element structure or a multi-collector structure, as indicated by adjusting transistors Q31, Q32, . . . , Q3n.

When each of the adjusting transistors Q31, Q32, . . . , Q3n has the same emitter area, according to the equation (16), an output current per channel, ΔIout, is expressed as follows.

$$\Delta Iout = (1/n) \times (I2/I1) \times (Iin + (\Sigma S3 - (I1/I2) \times (S1 + S2)) \times Io) \quad (33)$$

According to this, when satisfying the following equation:

$$\Sigma S3 = (I1/I2) \times (S1 + S2), \quad (34)$$

a total output current Iout is expressed as follows.

$$Iout = (I2/I1) \times Iin \quad (17)$$

With this, it is possible to output the individual output current ΔIout which is the product of the signal current Iin and the current ratio I2/I1 of the current mirror section 41, without being affected by photocurrents IPD and IPD3'.

Here, ΣS3 is the total sum of areas S31, S32, . . . , S3n of the epitaxial layers in the respective adjusting transistors Q31, Q32, . . . , Q3n. Further, the photocurrent IPD3' is the total sum of photocurrents generated by the adjusting transistors Q31 through Q3n.

Figure 6:
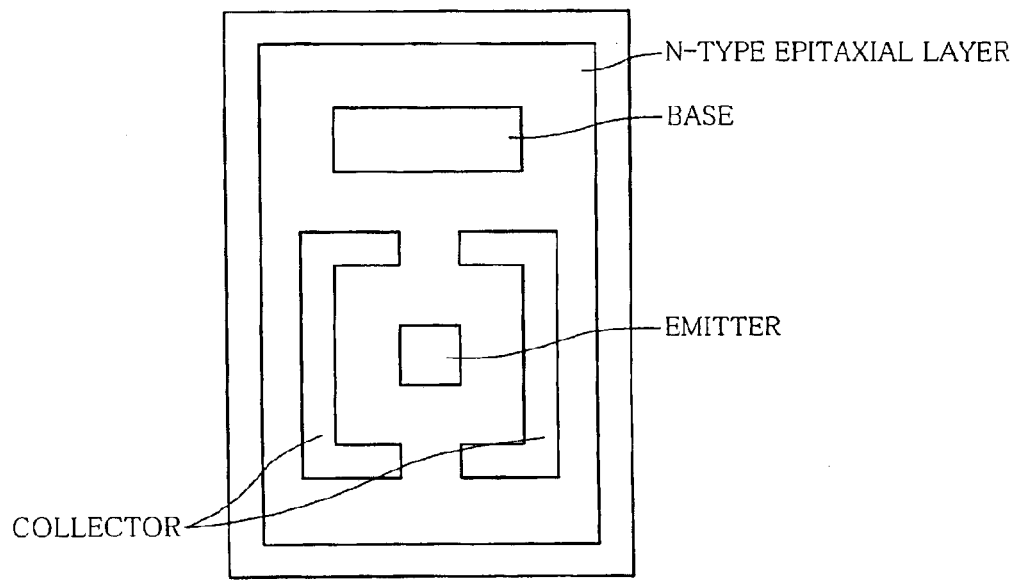
FIGS. 6(*a*) and 6(*b*) are diagrams showing examples of element configuration in the multi-collector structure of FIG. 5.
Figure 6:
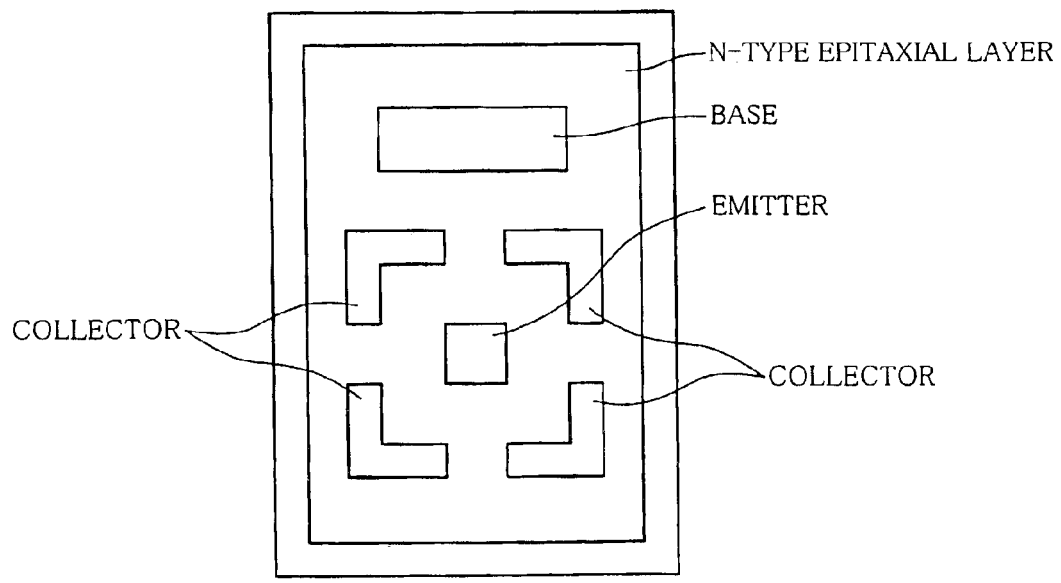

FIGS. 6(a) and 6(b) are diagrams showing examples of element configuration in the multi-collector structure as described above. Further, as previously described, FIG. 7 is a diagram schematically showing a structure of a p-type transistor.

FIG. 6(a) shows an example where the collector is divided into two. Here, a pair of the configurations of FIG. 7 are symmetrically arranged. On the other hand, FIG. 6(b) shows an example where the collector is divided into four. Here, each of the collectors is arranged at four corners to surround the emitter, and the base is provided on one side outside the collectors.

Such arrangements can achieve a plural number of outputs that have compensated the photocurrents IPD and IPD3'. Further, in the arrangement, the components for compensation are commonly used, thereby further reducing an element area.

Note that, it is obvious that the n-type transistor Q13 also can achieve the same effects by employing the parallel-element or multi-collector structure.

Further, the current mirror circuits 40, 50, 60, 70, 80 can be preferably applied to an optical signal circuit provided in a vicinity of an electro-optic conversion element (such as a light-emitting diode) and a photo-electric conversion element (such as a photodiode).

This is because, a signal light with respect to the conversion element and an external light are likely to be incident on the parasitic photodiode of such an optical signal circuit.

As described above, a current mirror circuit of the present invention, provided in an integrated circuit, is so arranged that an area of an epitaxial layer is adjusted in accordance with a current ratio of the current mirror so as to eliminate an influence of a photocurrent due to a parasitic photodiode.

Because of the structure of an integrated circuit, a parasitic photodiode is generated between the epitaxial layer and the substrate layer in the transistor. Under the circumstances where the parasitic photodiode is exposed to light, the photocurrent due to the parasitic photodiode emerges and influences the circuit.

Thus, the present invention takes notice of a fact that the photocurrent increases in proportion to the area of the epitaxial layer.

Namely, when a current mirror circuit is composed of transistors that inevitably form the parasitic photodiode, the area of the epitaxial layer in the transistor is adjusted in accordance with the current ratio of the current mirror, so as to allow the photocurrent to affect equally on both input and output sides of the current mirror circuit (namely, so as to cancel the photocurrent).

With this, in the current mirror circuit, it is possible to eliminate the influence of the photocurrent due to the parasitic photodiode, without considerably increasing an element area or taking special measures to shield light.

Note that, the area of the epitaxial layer becomes larger than an area corresponding to a required current capacitance, but still smaller than in a case where a compensating circuit is additionally provided.

Further, the current mirror circuit of the present invention is preferably arranged so as to have a pair of an input-side transistor Q1 and an output-side transistor Q2, which constitute a current mirror section, each having an emitter connected to a high-level power supply; and an adjusting transistor Q3 having (i) an emitter supplied with a collector current of the output-side transistor Q2 whose base and collector are connected with each other in a diode structure, (ii) a base connected to a collector of the input-side transistor Q1, and (iii) a collector that outputs an output current, a signal source 42 drawing out a current from the collector of the input-side transistor Q1, each of the transistors Q1, Q2, and Q3 being a p-type transistor in which an n-type epitaxial layer is formed on a p-type substrate layer, S3 satisfying S3=(I1/I2)×(S1+S2), where S1, S2, and S3 are areas of the n-type epitaxial layers in the transistors Q1, Q2, and Q3, respectively, and I2/I1 is a current ratio of the current mirror section.

With this arrangement, the collector of the adjusting transistor Q3 outputs a current which is the difference between the photocurrent generated at the parasitic photodiode of the adjusting transistor Q3 and the photocurrent generated at the transistors Q1 and Q2 which constitute the current mirror section. On the other hand, by selecting the area S3 of the n-type epitaxial layer in the adjusting transistor Q3 to satisfy the above equation, the current corresponding to the difference can be eliminated.

Thus, even when variation in collector potential of the adjusting transistor Q3 varies the collector-emitter voltages Vce (Q1) and Vce (Q2), or even when the current amplification ratio of each of the transistors Q1 through Q3 varies, the collector of the adjusting transistor Q3 can output a current in proportion to the current from the signal source 42.

Further, in this arrangement, the current mirror circuit preferably has a voltage equilibrating transistor Q4 located between the signal source 42 and the input-side transistor Q1, the voltage equilibrating transistor Q4 including: (i) an emitter connected to the collector of the input-side transistor Q1; and (ii) a base and a collector connected with each other, and connected to the signal source 42 and the base of the adjusting transistor Q3, the voltage equilibrating transistor Q4 being composed of a p-type transistor, an area S4 of an n-type epitaxial layer in the voltage equilibrating transistor Q4 satisfying S3+S4=(I1/I2)×(S1+S2).

With this arrangement, by adding the voltage equilibrating transistor Q4, the base-emitter voltages Vbe (Q1) and Vbe (Q2) of the transistors Q1 and Q2 become equal to each other. This accordingly allows the collector-emitter voltages Vce (Q1) and Vce (Q2) to be equal to each other. This further reduces an error in the current due to the Early effect.

Further, by selecting the area S4 of the n-type epitaxial layer in the added voltage equilibrating transistor Q4 to satisfy the above equation, the influence of the photocurrent can be eliminated.

Further, the current mirror circuit of the present invention is preferably arranged so as to have a pair of an input-side transistor Q11 and an output-side transistor Q12, which constitute a current mirror section, each having an emitter connected to a low-level power supply; and an adjusting transistor Q13 having (i) an emitter supplied with a collector current of the output-side transistor Q12 whose base and collector are connected with each other in a diode structure, (ii) a base connected to a collector of the input-side transistor Q1, and (iii) a collector that absorbs an output current, a signal source 42 outputting a current into the collector of the input-side transistor Q11, each of the transistors Q11, Q12, and Q13 being an n-type transistor in which an n-type epitaxial layer is formed on a p-type substrate layer, S13 satisfying S11=(I11/I12)×(S12+S13), where S11, S12, and S13 are areas of the n-type epitaxial layers in the transistors Q11, Q12, and Q13, respectively, and I12/I11 is a current ratio of the current mirror section.

With this arrangement, the collector of the adjusting transistor Q13 outputs a current which is the difference between the photocurrent generated at the parasitic photodiode of the adjusting transistor Q13 and the photocurrent generated at the transistors Q11 and Q12 which constitute the current mirror section.

On the other hand, by selecting the area S13 of the n-type epitaxial layer in the adjusting transistor Q13 to satisfy the above equation, the current corresponding to the difference can be eliminated.

Thus, even when variation in collector potential of the adjusting transistor Q13 varies the collector-emitter voltages Vce (Q11) and Vce (Q12), or even when the current amplification ratio of each of the transistors Q11 through Q13 varies, the collector of the adjusting transistor Q13 can absorb a current in proportion to the current from the signal source 42.

Further, in this arrangement, the current mirror circuit preferably has a voltage equilibrating transistor Q14 located between the signal source 42 and the input-side transistor Q11, the voltage equilibrating transistor Q14 including: (i) an emitter connected to the collector of the input-side transistor Q11; and (ii) a base and a collector connected with each other, and connected to the signal source 42 and the base of the adjusting transistor Q13, the voltage equilibrating transistor Q14 being composed of an n-type transistor, an area S14 of an n-type epitaxial layer in the voltage equilibrating transistor Q14 satisfying S11+S14=(I11/I12)×(S12+S13).

With this arrangement, by adding the voltage equilibrating transistor Q14, the base-emitter voltages Vbe (Q11) and Vbe (Q12) of the transistors Q11 and Q12 become equal to each other. This accordingly allows the collector-emitter voltages Vce (Q11) and Vce (Q12) to be equal to each other. This further reduces an error in the current due to the Early effect.

Further, by selecting the area S14 of the n-type epitaxial layer in the added voltage equilibrating transistor Q14 to satisfy the above equation, the influence of the photocurrent can be eliminated.

Further, each of the adjusting transistors Q3 and Q13 may have a parallel-element structure or a multi-collector structure.

With this, it is possible to achieve a plural number of outputs that have compensated the photocurrent. Further, in the arrangement, the components for compensation are commonly used, thereby further reducing an element area.

Further, an optical signal circuit of the present invention is arranged to use the above-described current mirror circuit.

With this arrangement, in an optical signal circuit provided in a vicinity of an electro-optic conversion element (such as a light-emitting diode) and a photo-electric conversion element (such as a photodiode), a signal light with respect to the conversion element and an external light are likely to be incident on the parasitic photodiode in the optical signal circuit. Thus, the present invention can be preferably adopted.

Further, in the arrangement of FIG. 1, the collector of the adjusting transistor Q3 outputs the output current Iout, which is the signal current Iin mirrored by the current ratio I2/I1 of the transistors Q1 and Q2. Further, even when the collector voltage of the adjusting transistor Q3 varies, the collector-emitter voltages Vce (Q1) and Vce (Q2) of the transistors Q1 and Q2 are constant, thereby reducing variation in the output current Iout. Further, an amount of the base currents Ib (Q1) and Ib (Q2) of the transistors Q1 and Q2 that affects the input current Iin can be reduced to 1/hfe by the adjusting transistor Q3.

Further, the arrangement of FIG. 1 shows that a current, which is the signal current Iin proportional to the current ratio I2/I1 of the current mirror section 41, is outputted as the output current Iout without the influences of the photocurrents IPD and IPD3.

Note that, the present embodiment has mentioned that the areas S3 and S13 in the adjusting transistors Q3 and Q13 are preferably set to satisfy the equation 11 or 24, However, the areas S1 through S3 and S1 through 13 in the transistors Q1 through Q3 and Q11 through Q13, respectively, may also be set to satisfy the equation 11 or 24.

Likewise, the present embodiment has mentioned that the areas S4 and S14 in the voltage equilibrating transistors Q4 and Q14 are preferably set to satisfy the equation 21 or 31. However, the areas S1 through S4 and S11 through 14 in the transistors Q1 through Q4 and Q11 through Q14, respectively, may also be set to satisfy the equation 21 or 31.

Further, the arrangement of FIG. 1 takes notice of a fact that, when a current mirror circuit is composed of transistors that inevitably form the parasitic photodiode PD, the photocurrent IPD increases in proportion to the area of the epitaxial layers S1+S2. Thus, the areas S1 and S2 of the epitaxial layers are adjusted in accordance with the current ratio I2/I1 of the current mirror, so as to allow the photocurrent IPD to affect equally on both input and output sides of the current mirror circuit 40 and so as to cancel the photocurrent. Here, the area of the epitaxial layers S1+S2 becomes larger than an area corresponding to a required current capacitance, but still smaller than in a case where a compensating circuit is additionally provided. With this, in the current mirror circuit 40, it is possible to eliminate the influence of the photocurrent IPD due to the parasitic photodiode PD, without considerably increasing an element area or taking special measures to shield light.

Further, notable in the current mirror circuit 50 of FIG. 2 is that a voltage equilibrating transistor Q4 made of a p-type transistor is further provided between the signal source 42 and the input-side transistor Q1. In the voltage equilibrating transistor Q4, the emitter is connected to the collector of the input-side transistor Q1; and the base and the connector, which are connected with each other, are connected to the signal source 42 and the base of the adjusting transistor Q3.

Further, in the current mirror circuit 60, the base of the adjusting transistor Q13 is connected to the collector of the input-side transistor Q11, namely, the signal source 42. Thus, the collector of the adjusting transistor Q13 absorbs the output current Iout, which is the signal current Iin mirrored by the current ratio I12/I11 of the transistors Q11 and Q12. Further, even when the collector voltage of the adjusting transistor Q13 varies, the collector-emitter voltages Vce (Q11) and Vce (Q12) of the transistors Q11 and Q12 are constant, thereby reducing variation in the output current Iout. Further, an amount of the base currents Ib (Q11) and Ib (Q12) of the transistors Q11 and Q12 that affects the input current Iin can be reduced to 1/hfe by the adjusting transistor Q13.

Further, the current mirror circuit 60 shows that a current, which is the signal current Iin proportional to the current ratio I12/I11 of the current mirror section 61, is absorbed as the output current Iout without the influences of the photocurrents IPD11 through IPD13.

Further, in the current mirror circuit 70, together with the area S14 of the n-type epitaxial layer in the voltage equilibrating transistor Q14, the areas S11 through S14 of the n-type epitaxial layers in the transistors Q11 through Q14, respectively, may also be set to satisfy the equation (31), thereby eliminating the influences of the photocurrents IPD11 through IPD14. Further, the current mirror circuit 80 outputs a current, which is the signal current Iin proportional to the current ratio I2/I1 of the current mirror section 41, as the individual output current ΔIout, without being affected by the photocurrents IPD and IPD3'.

FIG. 6(a) shows an example where the collector is divided into two. Here, a pair of the configurations of FIG. 7 are symmetrically arranged. On the other hand, with the arrangement of FIG. 6(b), a plural number of outputs that have compensated the photocurrents IPD and IPD3' can be achieved; and the components for compensation are commonly used, thereby further reducing an element area. Note that, it is obvious that the n-type transistor Q13 also can achieve the same effects by employing the parallel-element or multi-collector structure.

Further, the current mirror circuits 40, 50, 60, 70, 80 of the present invention can be preferably adopted in an optical signal circuit provided in a vicinity of an electro-optic conversion element and a photo-electric conversion element, such as a light-emitting diode and a photodiode. This is because, in the optical signal circuit, a signal light with respect to the electro-optic conversion element and the photo-electric conversion element and an external light are likely to be incident on the parasitic photodiode of the optical signal circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A current mirror circuit comprising a current mirror section which includes (A) an input-side transistor whose collector is connected to a signal source and (B) an output-side transistor whose base and collector are connected with each other in a diode structure, said current mirror circuit further comprising:

an adjusting transistor having (i) an emitter connected to the collector of said output-side transistor and (ii) a base connected to the collector of said input-side transistor, said adjusting transistor having an area of an epitaxial layer which is equal to a product of a reciprocal of a current ratio of said current mirror section and a sum of areas of epitaxial layers in said input-side transistor and said output-side transistor.

2. The current mirror circuit as set forth in claim 1, further comprising:

a voltage equilibrating transistor located between said signal source and said input-side transistor, said voltage equilibrating transistor having (i) an emitter connected to the collector of said input-side transistor, (ii) a base connected to the base of said adjusting transistor, and (iii) a collector connected to said signal source, said base and said collector of said voltage equilibrating transistor being connected with each other, a sum of areas of epitaxial layers in said voltage equilibrating transistor and said adjusting transistor being a product of a reciprocal of a current ratio of said current mirror section and a sum of areas of epitaxial layers in said input-side transistor and said output-side transistor.

3. The current mirror circuit as set forth in claim 1, wherein:

said input-side transistor, said output-side transistor, and said adjusting transistor are p-type transistors, emitters of said input-side transistor and said output-side transistor are both connected to a high-level power supply, and a collector of said adjusting transistor outputs an output current.

4. The current mirror circuit as set forth in claim 1, wherein:

said input-side transistor, said output-side transistor, and said adjusting transistor are n-type transistors, emitters of said input-side transistor and said output-side transistor are both connected to a low-level power supply, and a collector of said adjusting transistor absorbs an output current.

5. The current mirror circuit as set forth in claim 1, wherein:

said adjusting transistor has a parallel-element structure or a multi-collector structure.

6. An optical signal circuit comprising the current mirror circuit as set forth in claim 1.

7. A current mirror circuit provided in an integrated circuit, wherein:

an area of an epitaxial layer is adjusted in accordance with a current ratio of the current mirror so as to eliminate an influence of a photocurrent due to a parasitic photodiode.

8. The current mirror circuit as set forth in claim 7, comprising:

a pair of an input-side transistor Q1 and an output-side transistor Q2, which constitute a current mirror section, each having an emitter connected to a high-level power supply; and an adjusting transistor Q3 having (i) an emitter supplied with a collector current of said output-side transistor Q2 whose base and collector are connected with each other in a diode structure, (ii) a base connected to a collector of said input-side transistor Q1, and (iii) a collector that outputs an output current, a signal source 42 drawing out a current from the collector of said input-side transistor Q1, each of said transistors Q1, Q2, and Q3 being a p-type transistor in which an n-type epitaxial layer is formed on a p-type substrate layer, S3 satisfying $S3=(I1/I2) \times (S1+S2)$, where S1, S2, and S3 are areas of the n-type epitaxial layers in said transistors Q1, Q2, and Q3, respectively, and $I1/I2$ is a current ratio of said current mirror section.

9. The current mirror circuit as set forth in claim 8, further comprising:

a voltage equilibrating transistor Q4 located between said signal source 42 and said input-side transistor Q1, said voltage equilibrating transistor Q4 including:

(i) an emitter connected to the collector of said input-side transistor Q1; and (ii) a base and a collector connected with each other, and connected to said signal source 42 and the base of said adjusting transistor Q3, said voltage equilibrating transistor Q4 being composed of a p-type transistor, an area S4 of an n-type epitaxial layer in said voltage equilibrating transistor Q4 satisfying $S3+S4=(I1/I2) \times (S1+S2)$.

10. The current mirror circuit as set forth in claim 7, comprising:

a pair of an input-side transistor Q11 and an output-side transistor Q12, which constitute a current mirror section, each having an emitter connected to a low-level power supply; and an adjusting transistor Q13 having (i) an emitter supplied with a collector current of said output-side transistor Q12 whose base and collector are connected with each other in a diode structure, (ii) a base connected to a collector of said input-side transistor Q11, and (iii) a collector that absorbs an output current, a signal source 42 outputting a current into the collector of said input-side transistor Q11, each of said transistors Q11, Q12, and Q13 being an n-type transistor in which an n-type epitaxial layer is formed on a p-type substrate layer, S13 satisfying $S11=(I11/I12) \times (S12+S13)$, where S11, S12, and S13 are areas of the n-type epitaxial layers in said transistors Q11, Q12, and Q13, respectively, and $I12/I11$ is a current ratio of said current mirror section.

11. The current mirror circuit as set forth in claim 10, further comprising:

a voltage equilibrating transistor Q14 located between said signal source 42 and said input-side transistor Q11, said voltage equilibrating transistor Q14 including:

(i) an emitter connected to the collector of said input-side transistor Q11; and (ii) a base and a collector connected with each other, and connected to said signal source 42 and the base of said adjusting transistor Q13, said voltage equilibrating transistor Q14 being composed of an n-type transistor, an area S14 of an n-type epitaxial layer in said voltage equilibrating transistor Q14 satisfying $S11+S14=(I11/I12) \times (S12+S13)$.

12. The current mirror circuit as set forth in claim 10, wherein:

said adjusting transistor Q13 has a parallel-element structure or a multi-collector structure.

13. The current mirror circuit as set forth in claim 8, wherein:

said adjusting transistor Q13 has a parallel-element structure or a multi-collector structure.

14. An optical signal circuit using the current mirror circuit as set forth in claim 7.

* * * * *